(12) United States Patent
Mehta et al.

(10) Patent No.: US 7,723,833 B2
(45) Date of Patent: May 25, 2010

(54) STACKED DIE PACKAGES

(75) Inventors: Gaurav Mehta, Singapore (SG); Hien Boon Tan, Singapore (SG); Susanto Tanary, Singapore (SG); Mary Annie Cheong, Singapore (SG); Anthony Yi Sheng Sun, Singapore (SG); Chuen Khiang Wang, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 345 days.

(21) Appl. No.: 11/846,665

(22) Filed: Aug. 29, 2007

(65) Prior Publication Data

US 2008/0054435 A1    Mar. 6, 2008

Related U.S. Application Data

(60) Provisional application No. 60/840,952, filed on Aug. 30, 2006.

(51) Int. Cl.
*H01L 23/02* (2006.01)
*H01L 21/48* (2006.01)
*H01L 23/28* (2006.01)

(52) U.S. Cl. .................... 257/686; 438/109; 438/127; 257/787

(58) Field of Classification Search ............... 257/685, 257/686, 787
See application file for complete search history.

(56) References Cited

U.S. PATENT DOCUMENTS

| | | | |
|---|---|---|---|
| 5,963,429 A * | 10/1999 | Chen | 361/764 |
| 6,014,586 A | 1/2000 | Weinberg et al. | |
| 6,201,302 B1 | 3/2001 | Tzu | |
| 6,365,963 B1 * | 4/2002 | Shimada | 257/686 |
| 6,365,966 B1 | 4/2002 | Chen et al. | |
| 6,518,655 B2 * | 2/2003 | Morinaga et al. | 257/678 |
| 6,713,857 B1 * | 3/2004 | Tsai | 257/686 |
| 6,731,009 B1 | 5/2004 | Jones et al. | |
| 6,818,978 B1 * | 11/2004 | Fan | 257/686 |
| 6,833,619 B1 | 12/2004 | Jang et al. | |
| 7,166,917 B2 * | 1/2007 | Yang et al. | 257/724 |
| 7,211,883 B2 * | 5/2007 | Oka et al. | 257/678 |
| 7,217,596 B2 | 5/2007 | Cobbley et al. | |
| 2002/0180020 A1 * | 12/2002 | Lin et al. | 257/686 |
| 2003/0038374 A1 * | 2/2003 | Shim et al. | 257/777 |
| 2005/0230799 A1 | 10/2005 | Kang | |

(Continued)

FOREIGN PATENT DOCUMENTS

WO    99/09596    2/1999

*Primary Examiner*—Scott B Geyer
(74) *Attorney, Agent, or Firm*—Sughrue Mion, PLLC (57) ABSTRACT

A stacked die semiconductor package that includes a substrate with a plurality of adhesive portions arranged in a manner to create at least one gap between the adhesive portions. The package also includes a first semiconductor chip having a non-active surface in contact with the adhesive portions, and an active surface being electrically connected to the substrate. In the package, a second semiconductor chip the non-active surface of the second semiconductor chip is attached to the non-active surface of the first semiconductor chip by a layer of adhesive therebetween. The active surface of the second semiconductor chip is electrically connected to the substrate. An encapsulant material covers the first and second semiconductor chips and their associated electrical connections. The encapsulating material fills the at least one gap between the plurality of adhesive portions and thereby encapsulates the second semiconductor chip and its associated electrical connection.

18 Claims, 7 Drawing Sheets

U.S. PATENT DOCUMENTS

2006/0022323 A1 2/2006 Swee Seng
2006/0270104 A1 11/2006 Trovarelli et al.
2007/0132081 A1 6/2007 Wang et al.
2007/0152314 A1 7/2007 Manepalli et al.

* cited by examiner

STACKED DIE PACKAGES

This Application claims benefit of U.S. Provisional Application No. 60/840,952 filed Aug. 30, 2006, which is incorporated herein by reference.

BACKGROUND OF THE INVENTION

1. Field of the Invention

The present invention relates to stacked die packages and methods of producing the same.

2. Description of the Related Art

A stacked die package typically comprises a plurality of dies packaged in a vertical stack. The stacked die package, when compared to single die packages, has increased functionality as multiple dies with different functions are contained within the same package. A conventional method of assembling the stacked die package involves seating the smaller dies on top of the larger dies to create a pyramid structure such that each die does not seat on the periphery die immediately below it where wire bonding is effected. However, such a stacked die package structure requires the dies to have different surface areas to enable stacking and may also result in problems such as long wire connectivity constraints, poor electrical performance due to increased resistivity, and/ or wire sweep during encapsulation.

There is therefore a need to provide a stacked die package and methods of making the same that can at least ameliorate one or more of the problems as described above.

SUMMARY OF THE INVENTION

One embodiment of the invention is a semiconductor package that includes a substrate having a top surface and a bottom surface, the top surface including a plurality of adhesive portions arranged in a manner to create at least one gap between the adhesive portions. The package also includes a first semiconductor chip having an active surface and a non-active surface, the non-active surface of the first semiconductor chip being in contact with the adhesive portions, and the active surface of the first semiconductor chip being electrically connected to the substrate. In the package, a second semiconductor chip has an active surface and a non-active surface, the non-active surface of the second semiconductor chip being attached to the non-active surface of the first semiconductor chip by a layer of adhesive therebetween, and the active surface of the second semiconductor chip being electrically connected to the substrate. In the package an encapsulant material covers the first and second semiconductor chips and their associated electrical connections. The encapsulating material fills the at least one gap between the plurality of adhesive portions and thereby encapsulates the second semiconductor chip and its associated electrical connection.

Another embodiment of the invention is a semiconductor package that has a substrate with a top surface and a bottom surface, the top surface including a plurality of adhesive portions arranged in a manner to create at least one gap between the adhesive portions. The package includes a first semiconductor chip having an active surface and a non-active surface, the non-active surface of the first semiconductor chip being in contact with the adhesive portions, and the active surface of the first semiconductor chip being electrically connected to the substrate. The package includes a second semiconductor chip having an active surface and a non-active surface, the non-active surface of the second semiconductor chip being attached to the top surface of the substrate by a layer of adhesive therebetween, and the active surface of the second semiconductor chip being electrically connected to the substrate. An encapsulant material covers the first and second semiconductor chips and their associated electrical connections and the encapsulating material fills the at least one gap between the plurality of adhesive portions and thereby encapsulates the second semiconductor chip and its associated electrical connection.

The invention also includes a method manufacturing a semiconductor package with the following steps:

(a) providing a plurality of adhesive portions on a top surface of a substrate, the plurality of adhesive portions arranged in a manner to create at least one gap between the adhesive portions;

(b) attaching a non-active surface of a first semiconductor chip to the adhesive portions on the top surface of the substrate;

(c) attaching a non-active surface of a second semiconductor chip to the non-active surface of the first semiconductor chip using a layer of adhesive therebetween;

(d) electrically connecting active surfaces of the first and semiconductor chips to the substrate; and (e) covering the first and second semiconductor chips and their associated electrical connections with an encapsulant material, wherein during encapsulation, the at least one gap between the adhesive portions allows the encapsulant material to fill the space between the substrate and the first semiconductor chip to encapsulate the second semiconductor chip and its associated electrical connection.

The invention also includes a second method manufacturing a semiconductor package with the following steps:

(a) providing a plurality of adhesive portions on a top surface of a substrate, the plurality of adhesive portions arranged in a manner to create at least one gap between the adhesive portions;

(b) attaching a non-active surface of a first semiconductor chip to the adhesive portions on the top surface of the substrate;

(c) attaching a non-active surface of a second semiconductor chip a top surface of the substrate using a layer of adhesive therebetween;

(d) electrically connecting active surfaces of the first and semiconductor chips to the substrate; and (e) covering the first and second semiconductor chips and their associated electrical connections with an encapsulant material, wherein during encapsulation, the at least one gap between the adhesive portions allows the encapsulant material to fill the space between the substrate and the first semiconductor chip to encapsulate the second semiconductor chip and its associated electrical connection.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 4B(i) is a top view of a substrate, a first semiconductor chip and a second semiconductor chip of the stacked die package of FIG. 3 after stacking. FIG. 4B(ii) is a top view of a substrate, a first semiconductor chip and a second semiconductor chip of a variation of the stacked die package of FIG. 3.

DETAILED DESCRIPTION OF THE ILLUSTRATIVE NON-LIMITING EMBODIMENTS OF THE INVENTION

Hereinafter, the present invention will be described in detail by way of exemplary embodiments with reference to the drawings. The described exemplary embodiments are intended to assist in the understanding of the invention, and are not intended to limit the scope of the invention in any way. Throughout the drawings for explaining the exemplary embodiments, those components having identical functions carry the same reference numerals for which duplicate explanations will be omitted.

Figure 1:
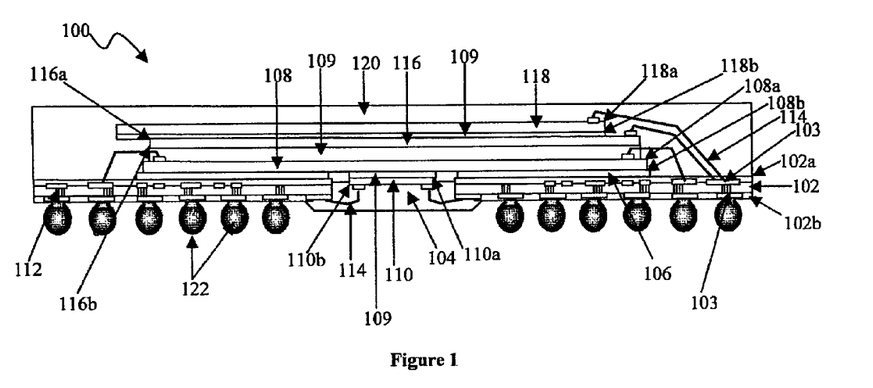
FIG. 1 is a cross-section of one embodiment of a stacked die package.
Figure 1A:
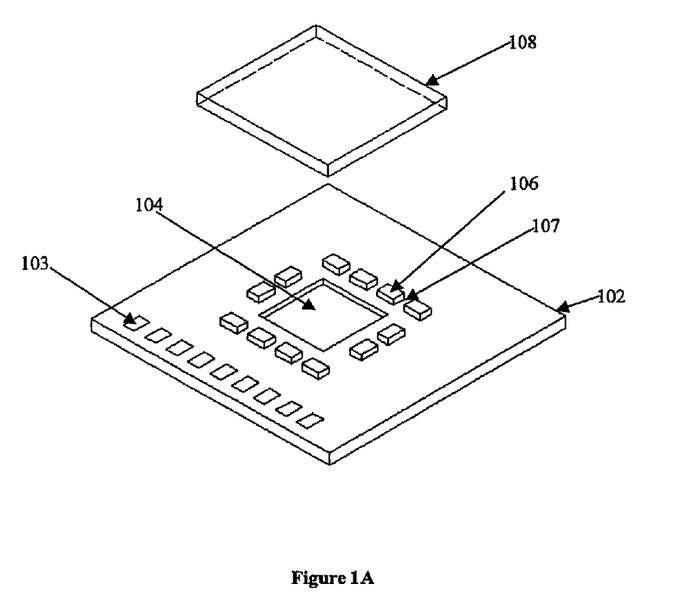
FIG. 1A is a top view of a substrate and a first semiconductor chip of the stacked die package of FIG. 1.

A non-limiting embodiment of the invention is described herein with reference to FIGS. 1 and 1A. FIG. 1 shows an example of a stacked die package 100 in accordance with the embodiment. The stacked die package 100 comprises a substrate 102 having a top surface 102a and a bottom surface 102b, with a hole extending at least partially from the top surface 102a toward the bottom surface. In this embodiment, the hole is in the form of a window opening 104 that is fully extended from the top surface 102a to the bottom surface 102b of the substrate 102. Methods for creating the window opening 104 are well known to those of skill in the art; and therefore, the details of creating the window opening will not be described herein. The substrate 102 comprises a plurality of bond fingers 103 which are positioned on the top surface 102a and on the bottom surface 102b of the substrate 102. One exemplary arrangement of the bond fingers 103 is shown in FIG. 1A. The top surface 102a of the substrate 102 has a plurality of adhesive portions 106 arranged in a manner to create gaps 107 between them. The adhesive portions 106 can function both as an adhesive and as spacers or interposers between the substrate 102 and a semiconductor chip, for example a first semiconductor chip 108, stacked above the substrate 102. The adhesive portions 106 can be of a material that will allow adhesion to take place, for example, an epoxy. The adhesive portions 106 may be dispensed or printed onto the substrate 102 or attached to the substrate 102 after it has been cut into the desired shape.

A first semiconductor chip 108, having a top active surface 108a and a bottom non-active surface 108b, resides on the adhesive portions 106, with the bottom non-active surface 108b of the first semiconductor chip 108 in contact with the adhesive portions 106. A second semiconductor chip 110, having a top non-active surface 110a and a bottom non-active surface, is attached to the bottom non-active surface 108b of the first semiconductor chip 108 by a layer of adhesive 109 therebetween. The adhesive 109 can be an adhesive that is commonly used in the art and can, for example, be an epoxy. The top non-active surface 110a of the second semiconductor chip 110 faces the non-active surface 108b of the first semiconductor chip 108. The surface area of the second semiconductor chip is of a size that can enable it to be positioned below the first semiconductor chip 108 and at least partially within the hole extending partially or fully from the top surface 102a toward the bottom surface 102b of the substrate 102.

For example, as shown in FIG. 1, the surface area of the second semiconductor chip is smaller than that of the first semiconductor ship 108 and the window opening 104 in the substrate 102 is such that the second semiconductor chip 110 can be partially within the window opening 104 when attached to the first semiconductor chip 108. The first semiconductor chip 108 is electrically connected to the substrate 102 by bond wires 114 extending from the top active surface 108a to the respective bond fingers 103 on the top surface 102a of the substrate 102. The second semiconductor chip 110 is electrically connected to the substrate 102 by bond wires 114 extending from the bottom active surface 110b of the second semiconductor chip 110 to the respective bond fingers 103 residing at the bottom surface 102b of the substrate 102.

A plurality of semiconductor chips may be stacked on the active surface 108a of the first semiconductor chip 108 using layers of adhesive 109 between the semiconductor chips. Referring, for example, to FIG. 1, a third semiconductor chip 116 is further stacked above the active surface 108a of the first semiconductor chip 108 using a layer of adhesive 109 therebetween. In addition to providing adhesion, the layer of adhesive 109 can protect the top active surface of the semiconductor chip and the associated bond wires 114 on the active surface, when another semiconductor chip is stacked thereon. For the purposes of illustration and referring to FIG. 1, the adhesive layer 109 can protect the top active surface 108a of the first semiconductor chip 108 and the associated bond wires 114 on the active surface 108a, when the third semiconductor chip 116 is stacked thereon. The third semiconductor chip 116 has a top active surface 116a and a bottom non-active surface 116b. The bottom non-active surface 116b of the third semiconductor chip 116 faces the top active surface 108a of the first semiconductor chip 108 when stacked. Bond wires 114 also extend from the top active surface 116a of the third semiconductor chip 116 to the respective bond fingers 103 on the top surface 102a of the substrate 102 to electrically connect the third semiconductor chip 116 to the substrate 102. A fourth semiconductor chip 118 having a top active surface 118a and a bottom non-active surface 118b can also be stacked, with its non-active surface 118b facing downwards, on the top active surface 116a of the third semiconductor chip 116 using a layer of adhesive 109 therebetween. The arrangement of the fourth semiconductor 118 can, for example, be staggered from the third semiconductor chip 116 to avoid the bond wire 114 associated with the third semiconductor chip 116 as shown in FIG. 1. The fourth semiconductor chip 118 is electrically connected to the substrate 102 via a bond wire 114 extending from the top active surface 118a of the fourth semiconductor chip 118 to the bond fingers 113 on the top surface 102a of the substrate 102. It will be appreciated that the third and fourth semiconductor chips 116,118 need not be in the configuration as described in FIG. 1. For example, the fourth semiconductor chip 118 can be stacked in the same manner as described for the third semiconductor chip 116.

Within the substrate 102, there may be provided metal traces 112, which electrically connect the bond fingers 103 on the top 102a and bottom 102b surfaces of the substrate 102 such as those shown in FIG. 1. An encapsulant material 120 encapsulates the first, third and fourth semiconductor chips 108, 116, 118 and their associated bond wires 114 and fills the spaces between the gaps 107 and in the window opening 104 to encapsulate the second semiconductor chip 110. A solder material, for example solder balls 122 as shown in FIG. 1, can be attached to the bottom surface 102b of the substrate for further connection of the assembled package 100 to an external board.

Figure 2A:
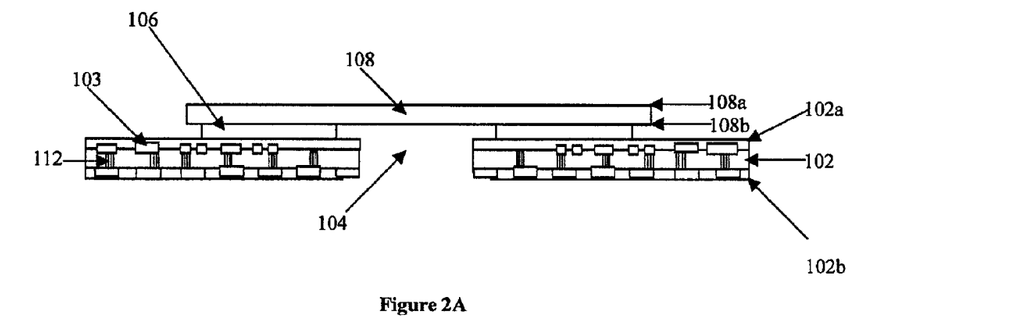
FIGS. 2A-2C show a method of making a stacked die package of FIG. 1.
Figure 2B:
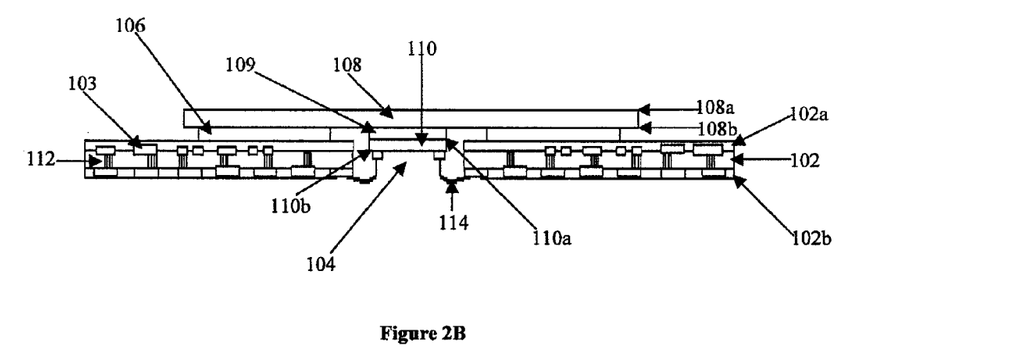

FIGS. 2A through 2C show one exemplary method of assembling the semiconductor package 100 as shown in FIG. 1. Referring to FIG. 2A, the first semiconductor chip 108 is attached to the substrate 102 using adhesive portions 106 as described above. Referring to FIG. 2B, the non-active top surface 110a of the second semiconductor chip 110 is then attached to the bottom non-active surface 108b of the first semiconductor chip 103 using a layer of adhesive 109, followed by electrically connecting the bottom active surface 110b of the second semiconductor chip 110, via bond wire 114, to the bond fingers 103 along the bottom surface 102b of the substrate 102.

Figure 2C:
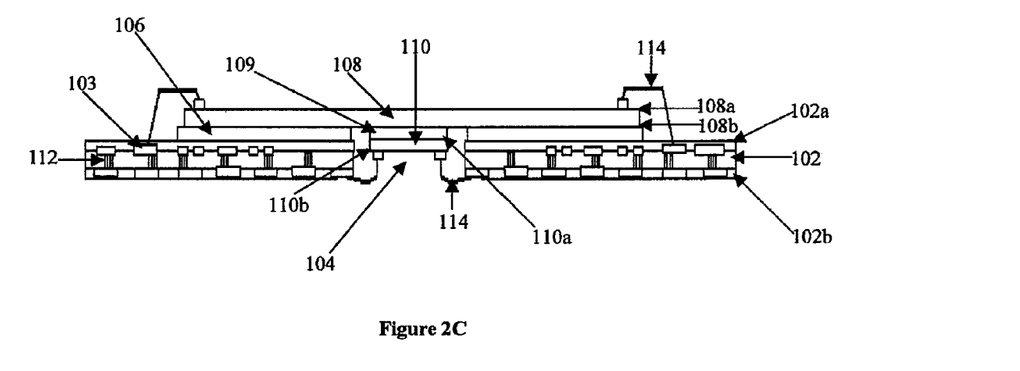

Referring to FIG. 2C, the active surface 108a of the first semiconductor chip 108 is electrically connected to the bond fingers 103 along the top surface 102a of the substrate 102. The third and fourth semiconductor chips 116, 118 are subsequently stacked above the active surface 108a of the first semiconductor chip 108 using layers of adhesive 115, 117 as described above.

Thereafter, an encapsulant material 120 is used to protect the bond wires 114 and the semiconductor chips 108, 110, 116, 118. During encapsulation, the encapsulant material 120 surrounds the first, third and fourth semiconductor chips 108, 116, 118 and their associated electrical connections or bond wires 114 and flows through the gaps between the adhesive portions and into the window opening 104 to encapsulate and protect the second semiconductor chip 110 and its associated bond wires 114.

Figure 3:
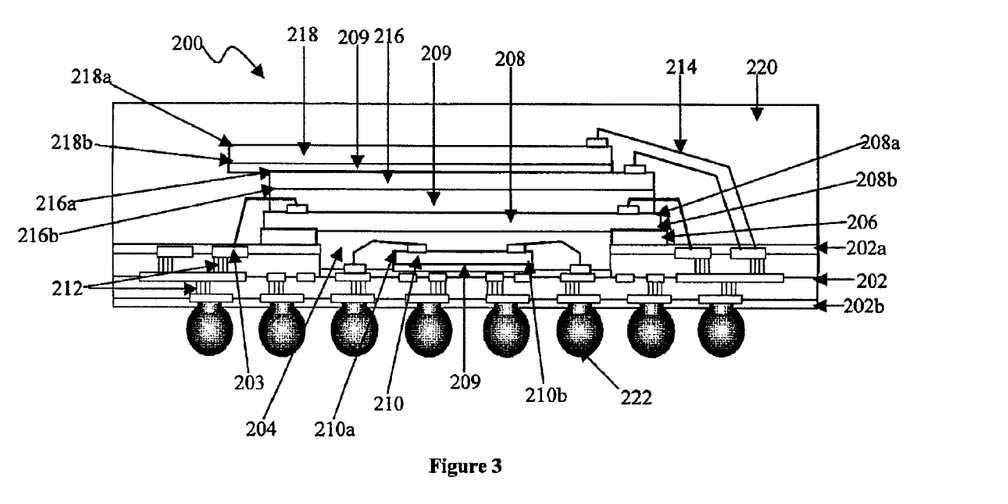
FIG. 3 is a cross-section of a first alternate embodiment of a stacked die package.
Figure 4A:
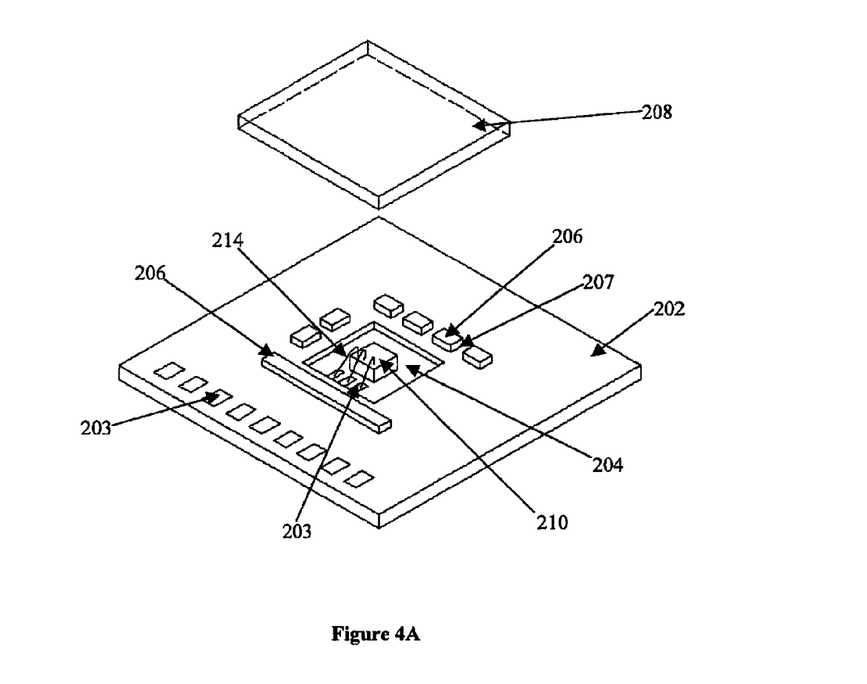
FIG. 4A is a top view of a substrate, a first semiconductor chip and a second semiconductor chip of the stacked die package of FIG. 3 before stacking.
Figure 4B:
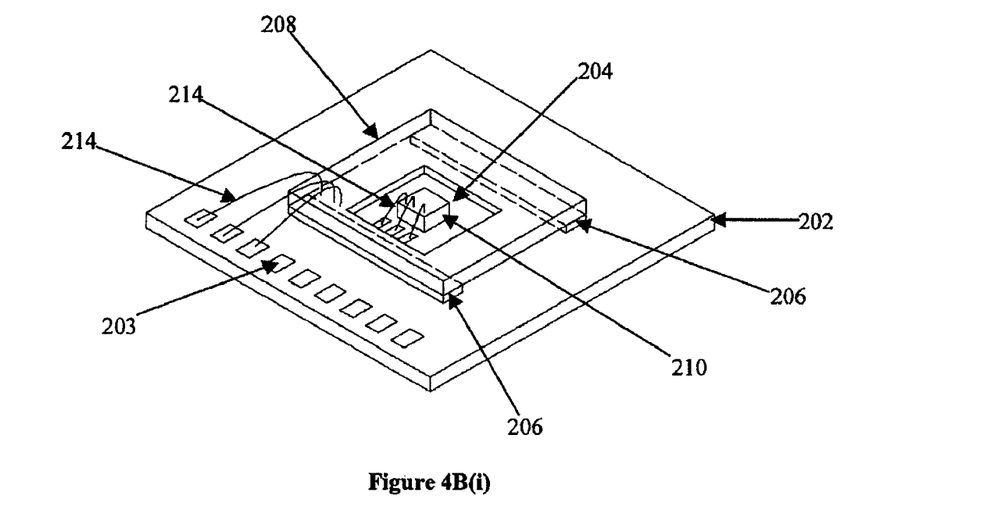
Figure 4C:
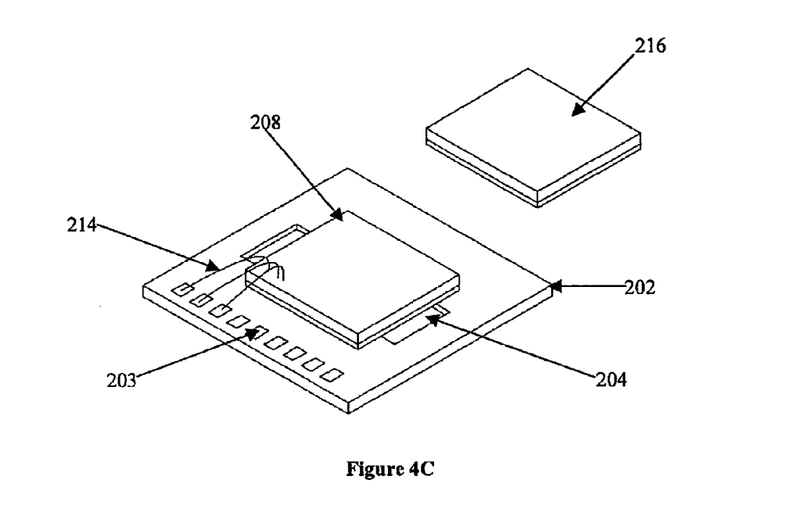
FIG. 4C is a top view of the structure as shown in FIG. 4B(i) with a third semiconductor chip.

An alternate embodiment of the invention is shown in FIGS. 3, 4A, 4(B)(i), 4(B)(ii) and 4C. FIG. 3 shows a semiconductor package 200 in accordance with this alternate embodiment. The semiconductor package 200 is similar to the one as described for the above embodiment except that the substrate 202 has a cavity 204 instead of a window opening 104, and the second semiconductor chip 210 is positioned within the cavity 204. The semiconductor package 200 includes a substrate 202 having a top surface 202a and a bottom surface 202b. The substrate 202 has a cavity 204 extending from the top surface 202a toward the bottom surface 202b. Methods for creating the cavity 204 are well known to those of skill in the art; and therefore, the details of creating the cavity 204 will not be described herein. The substrate 202 comprises a plurality of bond fingers 203 positioned on the top surface 202a of the substrate 202 and a plurality of bond fingers 203 positioned on the bottom surface 202b of the substrate 202. FIG. 4A shows an example arrangement of the bond fingers on the substrate 202. The top surface 202a of the substrate 202 has a plurality of adhesive portions 206 arranged in a manner to create gaps 207 between them.

A first semiconductor chip 208, having a top active surface 208a and a bottom non-active surface 208b, resides on the adhesive portions 206 with the bottom non-active surface 208b of the first semiconductor chip 208 in contact with the adhesive portions 206. A second semiconductor chip 210, having a top active surface 210a and a bottom non-active surface 210b, is attached to the floor of the cavity 204 by a layer of adhesive 209. The top active surface 210a of the second semiconductor chip 210 faces the non-active surface 208b of the first semiconductor chip 208. The surface area of the second semiconductor chip 210 is smaller than that of the first semiconductor ship and the cavity 204 in the substrate 202 is such that the second semiconductor chip 210 can be positioned within the cavity 204. The first semiconductor chip 208 is electrically connected to the substrate by bond wires 214 extending from the top active surface 208a to the respective bond fingers 203 on the top surface 202a of the substrate 202. The second semiconductor chip 210 is electrically connected to the substrate 202 by bond wires 214 extending from the top active surface 210a of the second semiconductor chip 210 to the respective bond fingers 203 residing on the floor of the cavity 204 as shown in FIG. 4A.

A third semiconductor chip 216 is further stacked above the active surface 208a of the first semiconductor chip 208 using a layer of adhesive 209. The third semiconductor chip 216 has a top active surface 216a and a bottom non-active surface 216b. The bottom non-active surface 216b of the third semiconductor chip 216 faces the top active surface 208a of the first semiconductor chip 208 when stacked. Bond wires 214 also extend from the top active surface 216a of the third semiconductor chip 216 to the respective bond fingers 203a on the top surface 202a of the substrate 202 to electrically connect the third semiconductor chip 216 to the substrate 202. A fourth semiconductor chip 218 having a top active surface 218a and a bottom non-active surface 218b can also be stacked, with its non-active surface 218b facing downwards, on the top active surface 216a of the third semiconductor chip 216 using a layer of adhesive 209. The arrangement of the fourth semiconductor chip 218 can be staggered from the third semiconductor chip 216 to avoid the bond wire 214 associated with the third semiconductor chip 216 as shown in FIG. 3. The fourth semiconductor chip 218 is electrically connected to the substrate 102 via a bond wire 214 extending from the top active surface 218a of the fourth semiconductor chip 218 to the bond fingers 213 on the top surface 202a of the substrate 202.

Within the substrate 202, there may be provided metal traces 212, which provide electrical communication between the bond fingers 203 on the top 202a and bottom 202b surfaces of the substrate 202 as shown in FIG. 3. An encapsulant material 220 encapsulates the first, third and fourth semiconductor chips 208,216,218 and fills the spaces between the gaps 207 and in the cavity 204 to encapsulate the second semiconductor chip 210. Solder balls 222 can be attached to the bottom surface 202b of the substrate for further connection of the assembled package 200 to an external board.

FIGS. 4A through 4C show an exemplary method of assembling the first, second and third semiconductor chips 208, 210, 216 onto the substrate 202 to form part of the semiconductor package 200 as shown in FIG. 3. Referring to FIGS. 4A and 4B(i), a second semiconductor chip 210 is attached to the floor of the cavity 204 using a layer of adhesive 209 and is electrically connected to the substrate by bond wires 214 extending from the active surface 210a of the second semiconductor chip 210 to the respective bond fingers 203 on the floor of the cavity 204. A first semiconductor chip 208 is attached to the substrate 202 and stacked over the second semiconductor chip 210 as shown in FIG. 4B(i) by adhesive portions 206. The associated electrical connections for the first semiconductor chip 208 are made via bond wires 214 extending from the active surface 208a of the first semiconductor chip 208 to the respective bond fingers 203 on the substrate 202 as described above.

FIG. 4B(ii) shows a variation of the first alternate embodiment. In this variation, the cavity 204 is of a wider size than the first semiconductor chip 108. It will be appreciated that the cavity 204 can have a different shape and need not be confined to those as described in the FIGS. 3, 4A and 4B(i). The shape of the cavity 204 can, for example, be rectangular as illustrated by FIG. 4B(ii) or other shapes. As shown for example in FIG. 4B(ii), the cavity 204 may not be fully covered by the first semiconductor chip 208 after it has been attached to the adhesive portions 206 of the substrate 202. The larger cavity 204 advantageously creates a larger flow path for the encapsulation material 220 to flow through the gaps 207 and into the cavity 204 to encapsulate the second semiconductor chip 210 within the cavity 204.

The third semiconductor chip 216 is subsequently stacked above the active surface 208a of the first semiconductor chip 208 using a layer of adhesive 209 as described above and as shown in FIG. 4C, followed by the stacking of a fourth semiconductor chip 218 using a layer of adhesive 209 in a staggered manner as described above to result in the stacked structure as shown in FIG. 3. Thereafter, an encapsulant material 220 is used to protect the bond wires 214 and the semiconductor chips 208, 210, 216, 218. During encapsulation, the encapsulant 120 surrounds the first, third and fourth semiconductor chips 208, 216, 218 and their associated electrical connections or bond wires 214 and flows through the gaps between the adhesive portions 206 and into the cavity 204 to encapsulate and protect the second semiconductor chip 210 and its associated bond wires 214.

Figure 5:
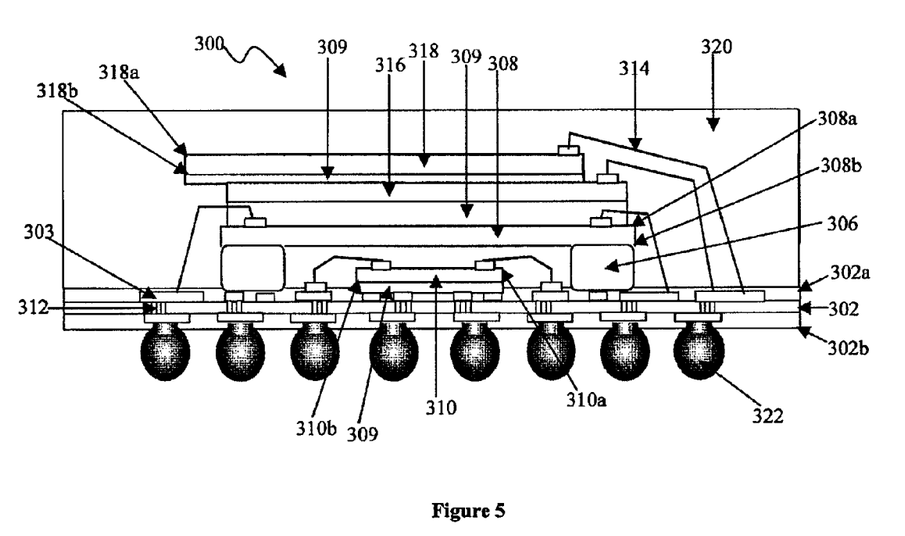
FIG. 5 is a cross-section of a second alternate embodiment of a stacked die package.
Figure 5A:
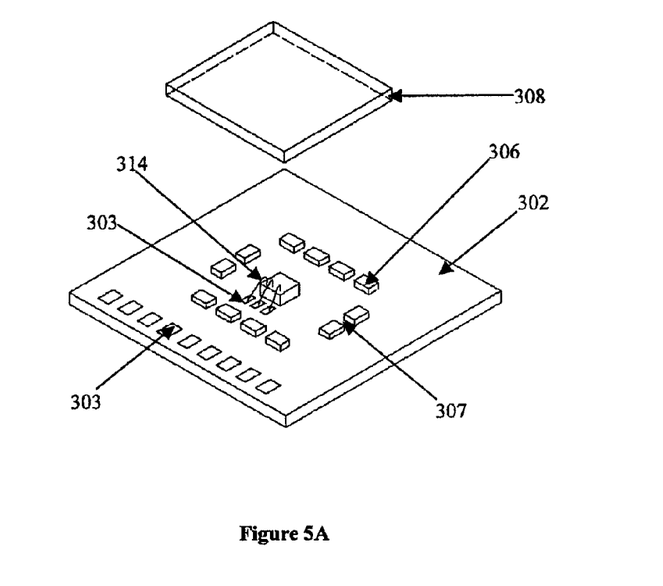
FIG. 5A is a top view of a substrate, a first semiconductor chip and a second semiconductor chip of the stacked die package of FIG. 5.

A semiconductor package 300 of a second alternate embodiment of the invention is shown in FIG. 5. The semiconductor package 300 is similar to those as described for the above embodiment and first alternate embodiment except that there is no cavity or a window opening in substrate 302. The substrate 302 has a top surface 302a and a bottom surface 302b. The substrate 302 comprises a plurality of bond fingers 303 positioned on the top surface 302a and a plurality of bond fingers 203 positioned on the bottom surface 302b. The top surface 302a of the substrate 302 has a plurality of adhesive portions 306 arranged in a manner to create gaps 306 between them. An example substrate 302 in accordance with the second alternate embodiment is shown in FIG. 5A.

A first semiconductor chip 308, having a top active surface 308a and a bottom non-active surface 308b, resides on the adhesive portions 306 with the bottom non-active surface 308b of the first semiconductor chip 308 in contact with the adhesive portions 306. A second semiconductor chip 310, having a top active surface 310a and a bottom non-active surface 310b, is attached to the top surface of the substrate by a layer of adhesive 309. The top active surface 310a of the second semiconductor chip 310 faces the non-active surface 308b of the first semiconductor chip 308. The surface area of the second semiconductor chip 310 is smaller than that of the first semiconductor ship 308 and the second semiconductor chip 310 can be positioned below the first semiconductor chip 308 and within a gap created between opposing pairs of adhesive portions. The first semiconductor chip 308 is electrically connected to the substrate 302 by bond wires 314 extending from the top active surface 308a to the respective bond fingers 303 on the top surface 302a of the substrate 302. The second semiconductor chip 310 is electrically connected to the substrate 302 by bond wires 314 extending from the top active surface 310a of the second semiconductor chip 310 to the respective bond fingers 303 residing on the top surface 302a of the substrate 302.

A third semiconductor chip 316 is further stacked above the active surface 308a of the first semiconductor chip 308 using a layer of adhesive 309. The third semiconductor chip 316 has a top active surface 316a and a bottom non-active surface 316b. The bottom non-active surface 316b of the third semiconductor chip 316 faces the top active surface 308a of the first semiconductor chip 308 when stacked. Bond wires 314 also extend from the top active surface 316a of the third semiconductor chip 316 to the respective bond fingers 303 on the top surface 302a of the substrate 302 to electrically connect the third semiconductor chip 316 to the substrate 302. A fourth semiconductor chip 318 having a top active surface 318a and a bottom non-active surface 318b can also be stacked with its non-active surface 318b facing downwards, on the top active surface 316a of the third semiconductor chip 316 using a layer of adhesive 309. The arrangement of the fourth semiconductor chip 318 can be staggered from the third semiconductor chip 316 to avoid the bond wire 314 associated with the third semiconductor chip 316 as shown, for example, in FIG. 5. The fourth semiconductor chip 318 is electrically connected to the substrate 302 via a bond wire 314 extending from the top active surface 318a of the fourth semiconductor chip 318 to the bond fingers 303 on the top surface 302a of the substrate 302.

Within the substrate 302, there may be provided metal traces 312, which provide electrical communication between the bond fingers 303 on the top 302a and bottom 302b surfaces of the substrate 302 as shown in FIG. 5. An encapsulant material 320 encapsulates the first, third and fourth semiconductor chips 308, 316, 318 and fills the spaces between the gaps 307 to encapsulate the second semiconductor chip 310. Solder balls 322 can be attached to the bottom surface 102b of the substrate for further connection of the assembled package 300 to an external board.

Figure 6A:
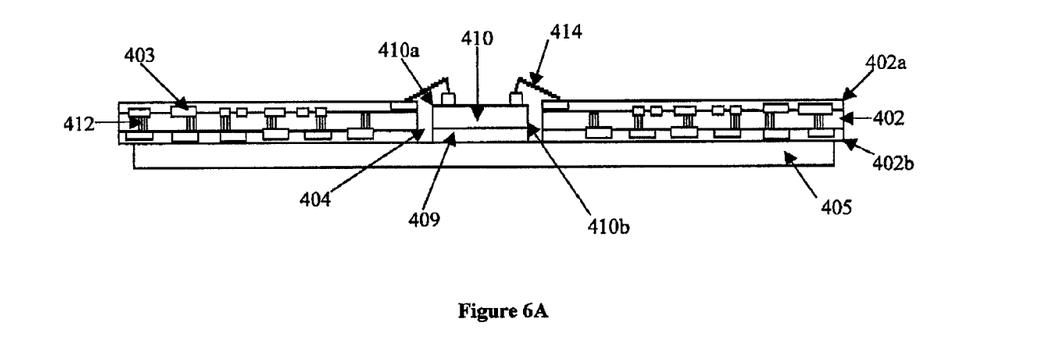
FIGS. 6A to 6C show cross-sections of a third alternate embodiment of a stacked die package, including a method of making the same.
Figure 6B:
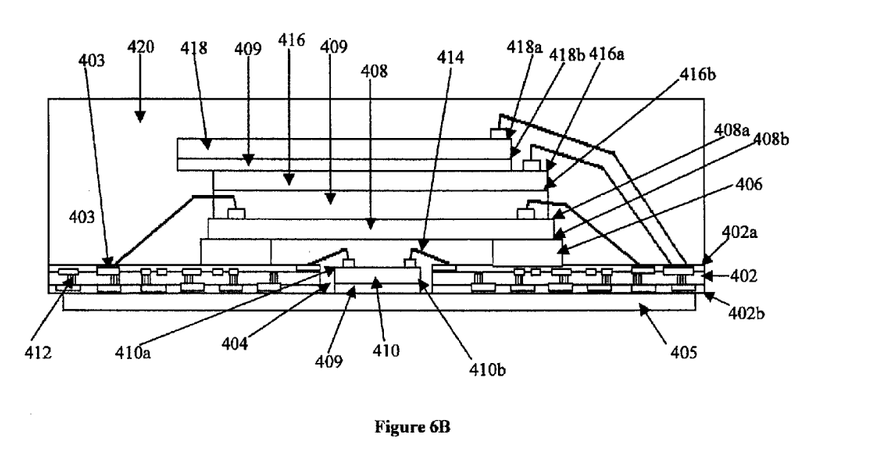
Figure 6C:
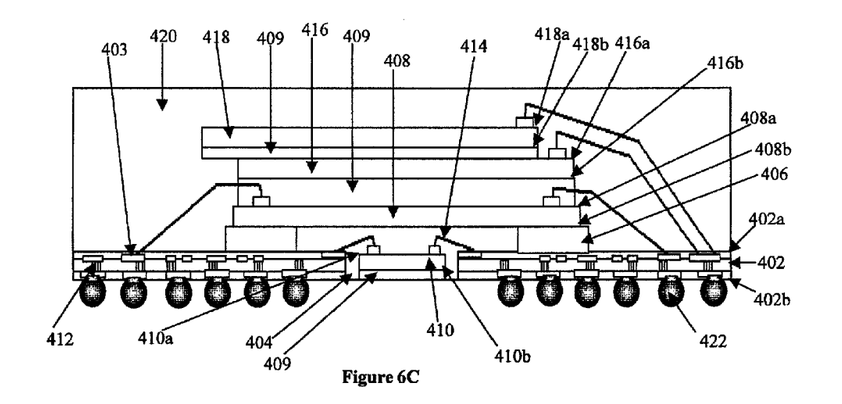

FIGS. 6A through 6C show a semiconductor package 400 in accordance with a third alternate embodiment and a method of assembling the semiconductor package 400 as shown in FIG. 6C. In this alternative embodiment, a substrate 403 having a top surface 402a and a bottom surface 402b may be provided with a window opening 404. The substrate 402 may be further provided with a tape carrier 405, on which a second semiconductor chip 410 is attached within the window opening 404 of the substrate 402. The second semiconductor chip 410 can be attached to the tape carrier 405 with an adhesive 409. The second semiconductor chip 410 is electrically connected to the substrate 402 by means a bond wires 414 extending from the top active surface 410a to the respective bond fingers 403 on the top surface 402a of the substrate 402. The top surface 402a of the substrate 402 is also provided with a plurality of adhesive portions 406 arranged in a manner to create gaps between the adhesive portions 406. A first semiconductor chip 408, having a top active surface 408a and a bottom non-active surface 408b, resides on the adhesive portions 406 with the bottom non-active surface 408b facing the top surface 402a of the substrate 402. A third semiconductor chip 416 having a top active surface 416a and a bottom non-active surface 416b is attached to the top active surface 408a of the first semiconductor chip 408 by a layer of adhesive 409 therebetween, and electrically connected to the substrate 402 by means of bond wires 414 extending from the top active surface 416a of the third semiconductor chip 416 to the respective bond fingers 403 on the top surface of the substrate 402. A fourth semiconductor chip 418 having a top active surface 418a and a bottom non-active surface 418b is attached to the top active surface 416a of the third semiconductor chip by a layer of adhesive 409 therebetween. The fourth semiconductor chip 418 can be arranged in a staggered manner to avoid the bond wire of the third semiconductor chip 416 as shown, for example, in FIG. 6B. An encapsulant material 420 covers the first, third and fourth semiconductor chips and fills the gaps between the adhesive portions 406 and in the window opening 404 to encapsulate the second semiconductor chip 410. The tape carrier 405 may then be removed from the final package as shown in FIG. 6C to enable attachment of solder balls 422 onto the bottom surface 402b of the substrate 402 for soldering onto an external board.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A semiconductor package comprising:
    a substrate having a top surface, a bottom surface and a cavity through the top and bottom surfaces of the substrate, the top surface comprising a plurality of adhesive portions arranged in a manner to create at least one gap between the adhesive portions, wherein a bottom of the at least one gap is defined by the top surface of the substrate;
    a first semiconductor chip having an active surface and a non-active surface, the non-active surface of the first semiconductor chip being in contact with the adhesive portions, and the active surface of the first semiconductor chip being electrically connected to the substrate;
    a second semiconductor chip having an active surface and a non-active surface, the non-active surface of the second semiconductor chip being attached to the non-active surface of the first semiconductor chip by a layer of adhesive therebetween, and the active surface of the second semiconductor chip being electrically connected to the substrate, wherein the cavity accommodates the second semiconductor chip; and
    an encapsulant material covering the first and second semiconductor chips, their associated electrical connections, and filling the at least one gap between the adhesive portions between the first semiconductor chip and substrate in one step.

2. The semiconductor package of claim 1, wherein said electrical connection is made by a bond wire.

3. The semiconductor package of claim 1, wherein the second semiconductor chip has a smaller surface area than that of the first semiconductor chip.

4. The semiconductor package of claim 1, wherein the active surface of the second semiconductor chip is electrically connected to the bottom surface of the substrate through the cavity.

5. The semiconductor package of claim 1, further comprising a third semiconductor chip attached to the active surface of the first semiconductor chip by a layer of adhesive.

6. A semiconductor package comprising:
    a substrate having a top surface, a bottom surface and a cavity extending at least partially from the top surface toward the bottom surface, the top surface comprising a plurality of adhesive portions arranged in a manner to create at least one gap between the adhesive portions, wherein a bottom of the at lest one gap is defined by the top surface of the substrate;
    a first semiconductor chip having an active surface and a non-active surface, the non-active surface of the first semiconductor chip being in contact with the adhesive portions, and the active surface of the first semiconductor chip being electrically connected to the substrate;
    a second semiconductor chip having an active surface and a non-active surface, the non-active surface of the second semiconductor chip being attached to a portion of the substrate in the cavity by a layer of adhesive therebetween, and the active surface of the second semiconductor chip being electrically connected to the substrate; and
    an encapsulant material covering the first and second semiconductor chips and their associated electrical connections, wherein the at least one gap between the adhesive portions on the substrate allows the encapsulant material to flow therethrough and encapsulate the first and second semiconductor chips and their associated electrical connections in one step.

7. The semiconductor package of claim 6, wherein the active surface of the second semiconductor chip is electrically connected to the top surface of the substrate.

8. The semiconductor package of claim 6, wherein the active surface of the second semiconductor chip is electrically connected to the floor of the cavity.

9. The semiconductor package of claim 6, further comprising a third semiconductor chip attached to the active surface of the first semiconductor chip by a layer of adhesive.

10. The semiconductor package of claim 6, wherein said first semiconductor chip does not fully cover the cavity.

11. A method of manufacturing a semiconductor package comprising:
    (a) providing a substrate having a cavity extending from a top surface to a bottom surface, a plurality of adhesive portions on a top surface of the substrate, the plurality of adhesive portions arranged in a manner to create at least one gap between the adhesive portions, wherein a bottom of the at least one gap is defined by the top surface of the substrate;
    (b) attaching a non-active surface of a first semiconductor chip to the adhesive portions on the top surface of the substrate;
    (c) attaching a non-active surface of a second semiconductor chip to the non-active surface of the first semiconductor chip using a layer of adhesive therebetween, the active surface of the second semiconductor chip resides partially within the cavity;
    (d) electrically connecting active surfaces of the first and semiconductor chips to the substrate; and
    (e) covering the first and second semiconductor chips and their associated electrical connections with an encapsulant material, wherein during encapsulation, the at least one gap between the adhesive portions on the substrate allows the encapsulant material to flow therethrough and encapsulate the first and second semiconductor chips and their associated electrical connections on one step.

12. The method of claim 11, wherein step (d) comprises electrically connecting the first and second semiconductor chips to the substrate using bond wires.

13. The method of claim 11, wherein in step (c) the second semiconductor chip has a smaller surface area than the first semiconductor chip.

14. The method of claim 11, wherein step (d) comprises electrically connecting an active surface of the second semiconductor chip to the bottom surface of the substrate through the cavity.

15. The method of claim 11, further comprising:
    (f) attaching a third semiconductor chip to the active surface of the first semiconductor ship by a layer of adhesive.

16. A method of manufacturing a semiconductor package comprising:
(a) providing a substrate having a cavity extending at least partially from a top surface to a bottom surface, and a plurality of adhesive portions on a top surface of the substrate, the plurality of adhesive portions arranged in a manner to create at least one gap between the adhesive portions, wherein a bottom of the at least one gap is defined by the top surface of the substrate;
(b) attaching a non-active surface of a first semiconductor chip to the adhesive portions on the top surface of the substrate;
(c) attaching a non-active surface of a second semiconductor chip to a portion of the substrate in the cavity using a layer of adhesive therebetween;
(d) electrically connecting active surfaces of the first and semiconductor chips to the substrate; and
(e) covering the first and second semiconductor chips and their associated electrical connections with an encapsulant material, wherein during encapsulation, the at least one gap between the adhesive portions on the substrate allows the encapsulant material to flow therethrough and encapsulate the first and second semiconductor chips and their associated electrical connections in one step.

17. The method of claim 16, wherein step (d) comprises electrically connecting an active surface of the second semiconductor chip to the floor of the cavity.

18. The method of claim 16, further comprising:
(f) attaching a third semiconductor chip to the active surface of the first semiconductor ship by a layer of adhesive.

* * * * *